United States Patent [19]
Bradley et al.

[11] Patent Number: 5,232,372
[45] Date of Patent: Aug. 3, 1993

[54] LAND GRID ARRAY CONNECTOR AND METHOD OF MANUFACTURE

[75] Inventors: Morgan J. Bradley, Harrisburg; George R. Schmedding, Hummelstown, both of Pa.

[73] Assignee: AMP Incorporated, Harrisburg, Pa.

[21] Appl. No.: 881,100

[22] Filed: May 11, 1992

[51] Int. Cl.[5] .............................................. H01R 9/09
[52] U.S. Cl. ........................................ 439/66; 29/834; 439/567; 439/591
[58] Field of Search ...................... 439/66, 74, 91, 591, 439/567; 29/874, 876, 884, 832, 834

[56] References Cited
U.S. PATENT DOCUMENTS 5,030,109 7/1991 Dery ................................... 439/841
5,061,191 10/1991 Casciotti et al. ...................... 439/66

Primary Examiner—Neil Abrams
Attorney, Agent, or Firm—William B. Noll

[57] ABSTRACT

A land grid array connector (10) includes a housing (20) and clamping lid (38) for interconnecting arrays of contact pads of a component (50) and the contact pads (14) of a circuit board (12) through a planar connector insert (50) having a plastic comb (51) with coil springs (72) threaded on teeth (54) of the comb and with plastic cross bars (60) threaded over the comb teeth to position the contact springs in rows compatible with the rows of contact pads. The cross bars and springs are alternated to define a planar structure with the springs on the centers to engage the pads of contacts when the insert is positioned within the connector and clamped to press the springs between the pads. A method of manufacture including the steps of assembly of comb, contact springs and cross bars and affixing the cross bars to the comb.

10 Claims, 6 Drawing Sheets

150 150

LAND GRID ARRAY CONNECTOR AND METHOD OF MANUFACTURE

This invention relates to an electrical connector of land grid array type utilized to interconnect planar arrays of contact pads of components and circuits, and a method of manufacture therefor.

BACKGROUND OF THE INVENTION

A widely used technique for interconnecting components such as integrated circuits to each other and to functioning devices is through printed wiring circuits. Components include insulating packages having leads in the form of pads on the surface or other contacts extending therefrom in rows to form planar disposed arrays are matched with conductive pads on circuits joined to circuit traces leading to and from the component. Interconnection between the conductive pads or leads of a component to the conductive pads or traces of a circuit is accomplished in a number of ways, including solder, or in instances where the removal and replacement of components is necessary during the life of a system by some suitable electrical connector or disconnect. U.S. Pat. No. 5,061,191 issued Oct. 29, 1991 shows such an arrangement wherein the component is held in a housing and driven against a planar connector to compress such connector and the terminals therein against the pads of a circuit to effect an interconnection that may be selectively separated and restored. U.S. patent application No. 07/686,100 filed Apr. 16, 1991, now abandoned, shows examples of three different kinds of contacts for three different kinds of applications that vary depending upon the rigor of environmental use. One of these examples features an array of coil springs forming individual contacts that interconnect the pads of components and circuits.

It is an object of the present invention to provide an improved planar connector for interconnecting the pads of components to the pads of circuits and a method of manufacture therefor. It is a further object to provide a planar connector insert adapted to be fitted within a housing to interconnect components to circuits, and a method of manufacture and assembly that facilitates the provision of large numbers of closely centered contacts in planar array. It is still a further object to provide an improved planar connector utilizing coil springs individually arrayed in patterns compatible with components and circuit boards wherein a high density of individual connections is achieved.

SUMMARY OF THE INVENTION

The invention contemplates a planar array connector insert featuring a plastic insulating comb having teeth that extend in a common direction on centers compatible with the centers of pads on component and circuits. Small, discrete coil springs are fitted over the teeth of the comb to reside in rows with plastic cross bars apertured to fit over the teeth of the comb positioned to hold the coil springs in rows on the comb. The pattern of coils is made to provide the interconnections where desired relative to the array of pads of component and circuit, coils being left out where none are required, and the cross bars are clamped into position on the comb by virtue of splits at the ends thereof that are clamped together, heat staked to be reflowed or through the use of an adhesive. The coil springs utilized with the connector and insert of the invention are preferably of the canted coil variety that have been found to have a more linear force deflection characteristic to better assure a consistent normal force of interconnection between contact pads as well as providing a redundancy of contact through the several turns of a coil. The cross bar elements are given a trapezoidal shape having end faces compatible with the slanted configuration of the coils and are made of a thickness transverse to the plane of the connector or insert slightly less than the relaxed thickness dimension of the coils to limit compression of the coils. This assures that no set of the coils can take place due to over-compression or due to use wherein temperature extremes cause plastic and metal movements. The teeth of the comb are given a rectilinear cross-sectional configuration that fits within the oval interdiameter of the coil to hold such coil oriented and preclude rotation that could cause a variation in compressive forces and result in variations in the normal forces effecting the desired low resistance, stable electrical interface.

Assembly of the comb having teeth adapted to receive the coil and cross bars having apertures adapted to receive the teeth, along with the fixing of the cross bars to the comb, allows for a precise manufacture of connector inserts of a planar disposition having desirable characteristics for interconnecting planar components to planar circuits.

The insert is fitted in a plastic housing with a lid clamping a component against the insert on a printed circuit board to interconnect the pads of component and board.

IN THE DRAWINGS

DETAILED DESCRIPTION OF THE INVENTION

Figure 1:
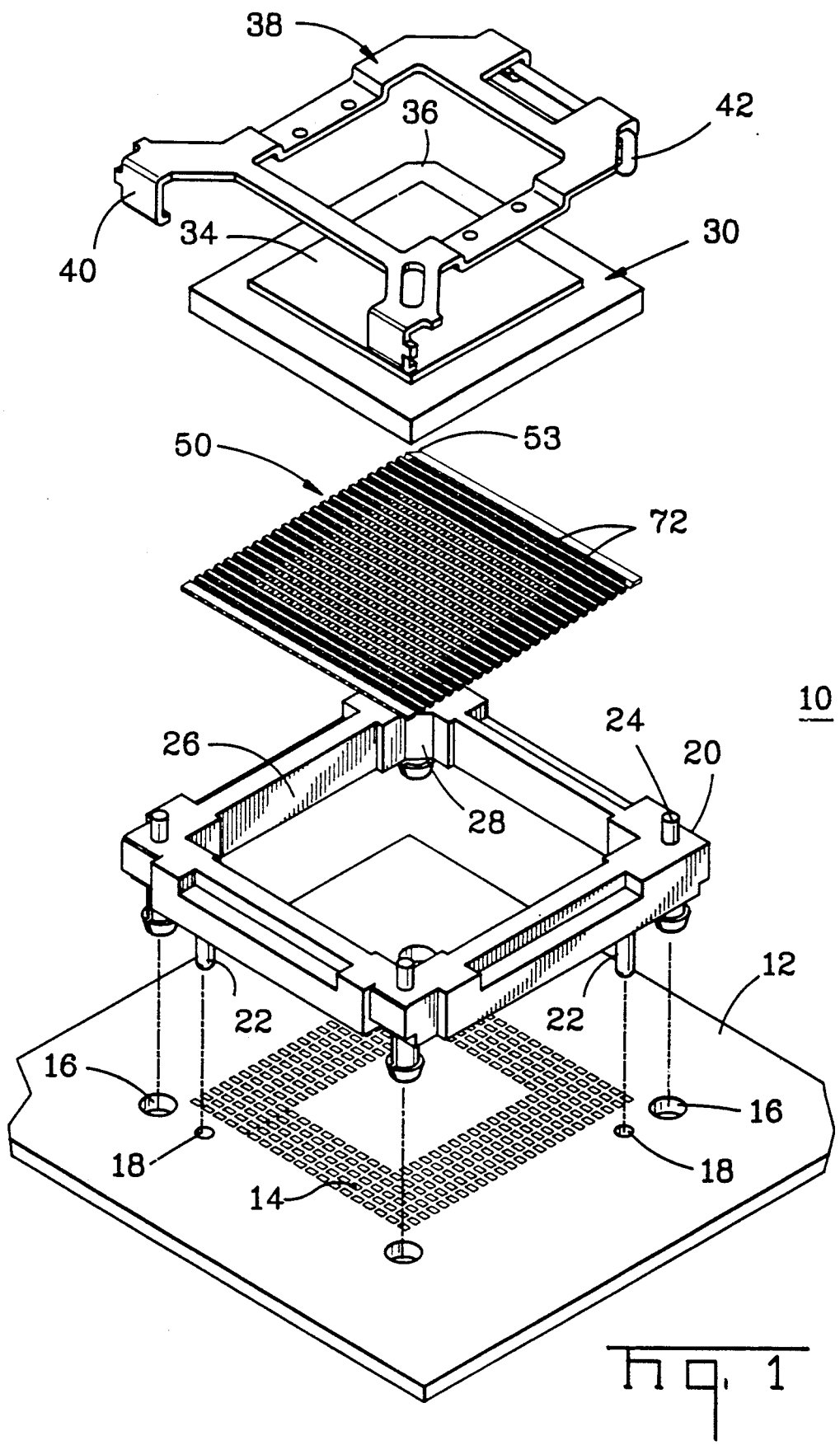
FIG. 1 is a perspective showing a connector, component, connector insert, housing, and printed circuit in an exploded view prior to assembly.

Referring now to FIG. 1, an assembly 10 is shown to include a circuit board 12 having an array of contact pads 14 on the upper surface thereof that are understood to be connected to traces not shown within laminations of board 12. These traces interconnect other arrays and various components to provide a given function to a device such as a computer, communication equipment, or the like. The board 12 includes four holes 16 that allow fasteners to affix a connector housing 20 to the board. Pilot or guide holes 18 are provided facilitating alignment in a precise manner of housing 20. Alignment pins 22 are shown extending from lower or bottom surface of housing 20 and fasteners 24 are shown extending from the housing aligned with holes 16. These fasteners may be considered to be of the expandable variety taught in the aforementioned U.S. application No. 07/686,100. The housing 20 may be considered to be formed of engineering plastic material having considerable dimensional integrity. The housing includes an inner opening 26 containing a corner flat 28 intended to align the connector insert 50 shown in FIG. 1 and the component 30, noting the flats on corresponding corners of the insert and component, flats 36 and 53 as shown in FIG. 1.

The component 30 may be seen to include a flat of metallic element 34 on the top thereof that may be considered as a heat sink and, not shown, an array of contact pads identical to the contact pads 14 but extending on the underside of component 30 and interconnected internally to the various devices therein.

Figure 2:
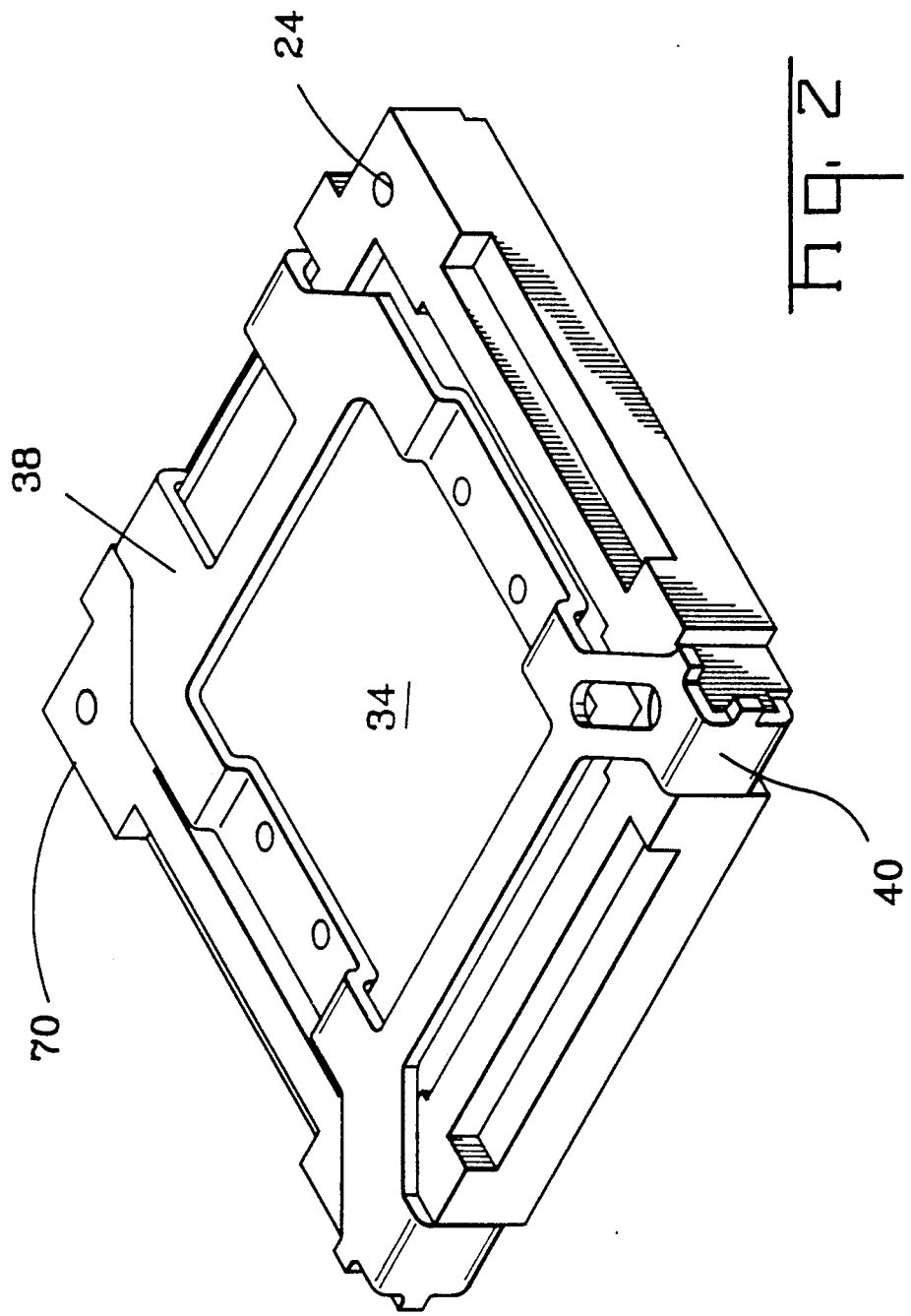
FIG. 2 is a perspective showing the connector of the invention as assembled.

A clamping lid 38 is shown, suitably formed of metal to include latches 40 and 42 on opposite sides thereof that engage the housing 20 through the underside thereof in the manner shown in FIG. 2. The lid 38 serves to provide a compressive force driving component 30 downwardly against the connector insert 50. This serves to compress springs 72 thereof and interconnect the pads of component 30 to the pads 14 of board 12 and thus interconnect the devices within component 30 to the system served by the circuit traces of board 12.

Figure 3:
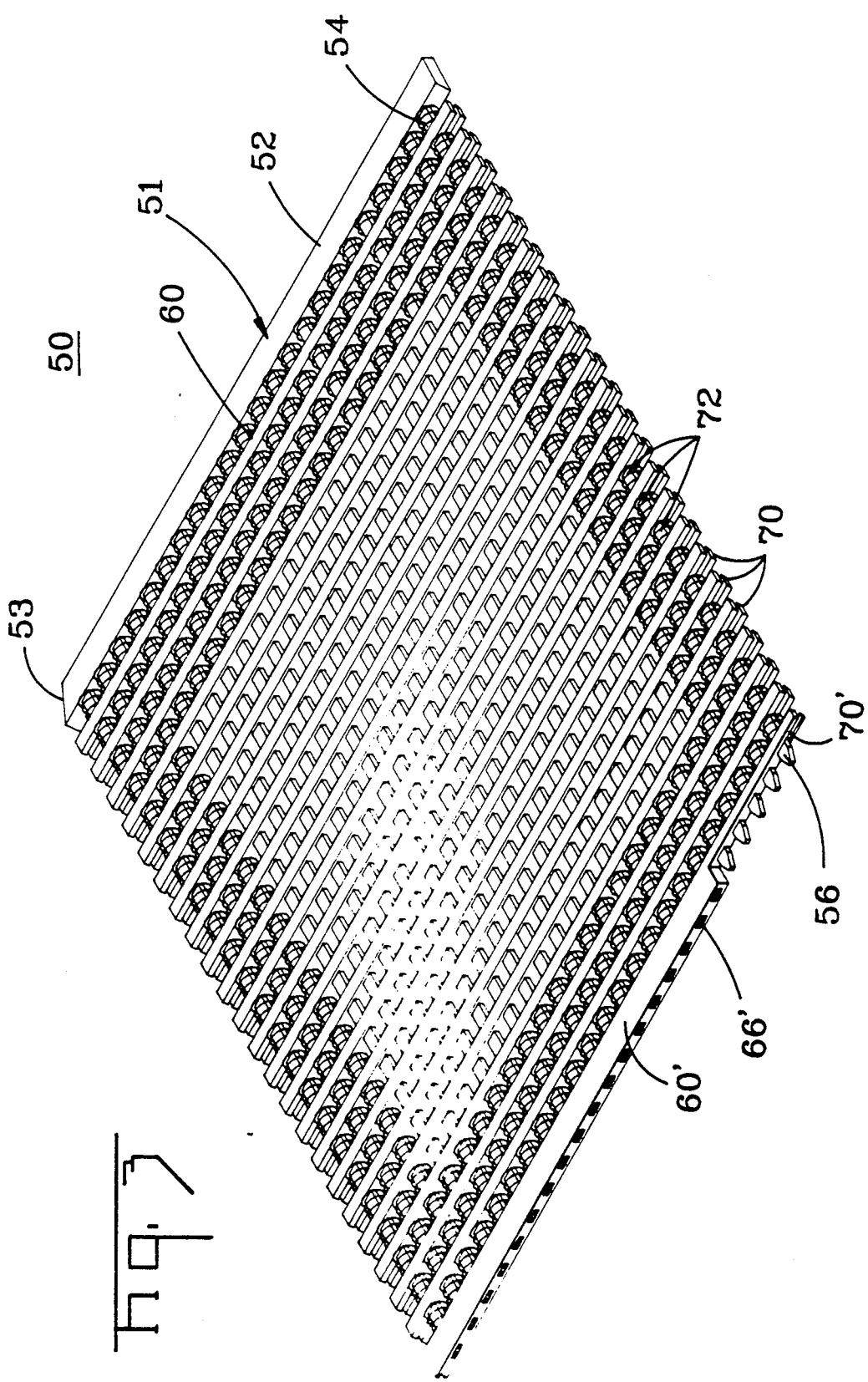
FIG. 3 is a perspective showing the connector insert as assembled with one end partially sectioned to show details.
Figure 4:
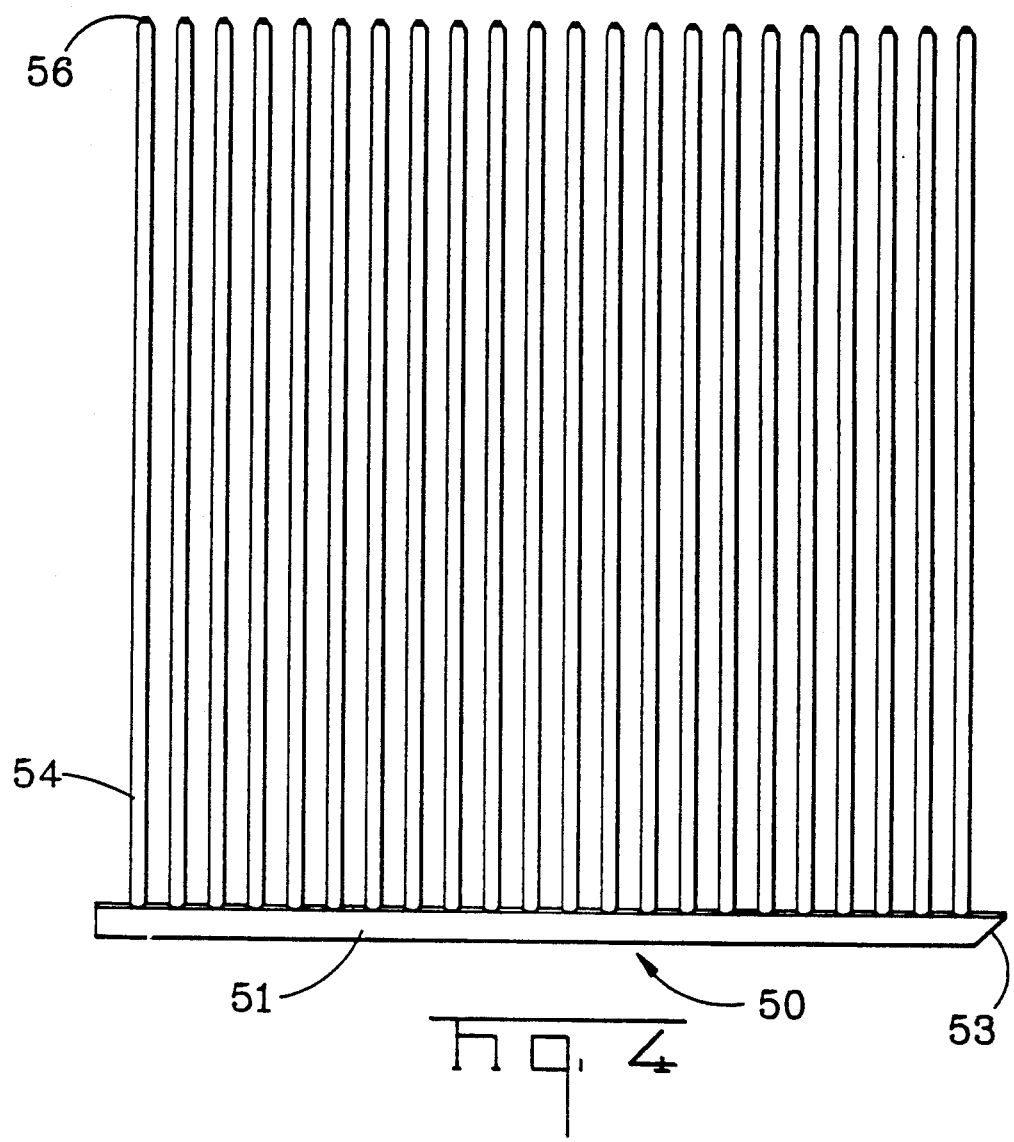
FIG. 4 is a plan view of the comb of the connector of the invention.
Figure 5:
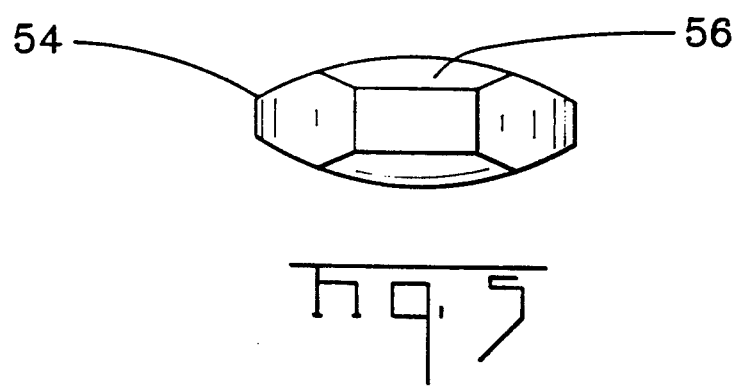
FIG. 5 is an end view showing on tooth of the comb of the connector of the invention.
Figure 6:
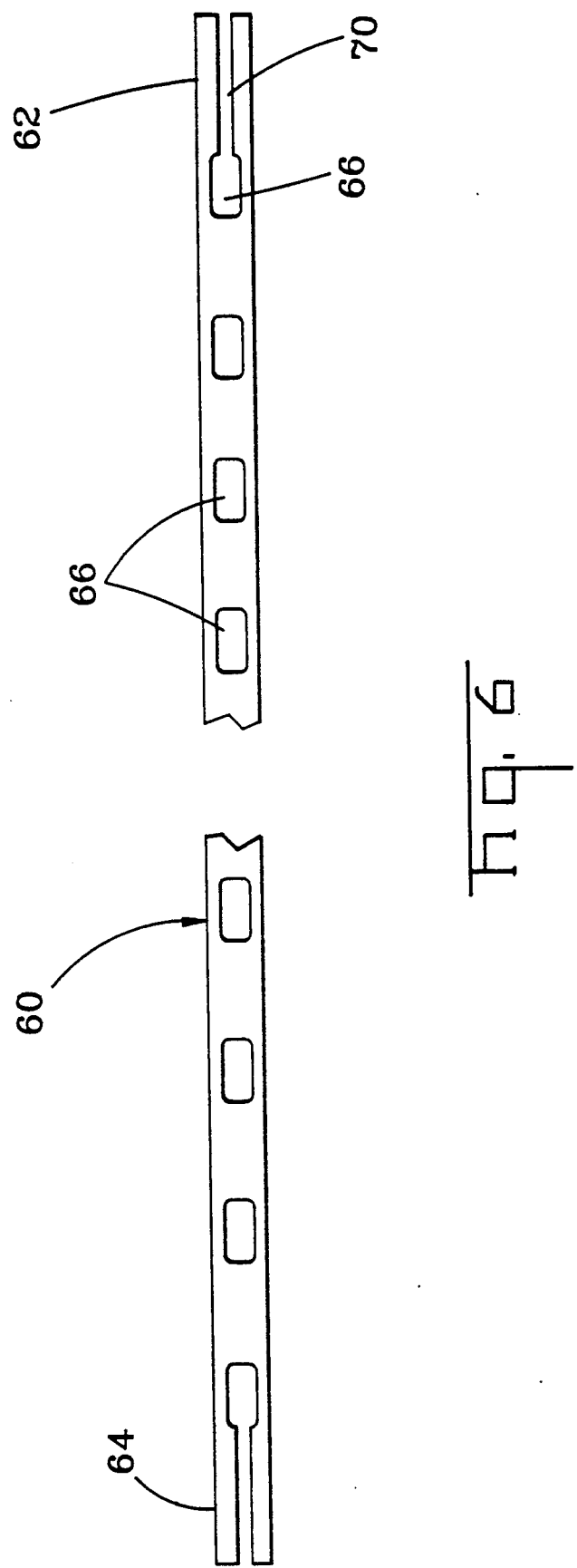
FIG. 6 is a side, elevational view of the cross bar of FIG. 5.
Figure 7:
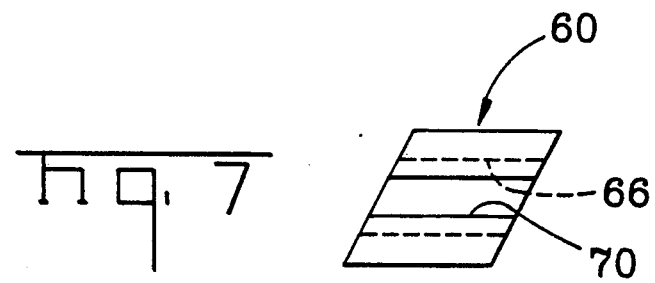
FIG. 7 is an end view, substantially enlarged from the earlier views of the cross bar of FIG. 6 taken along lines 7—7.
Figure 8:
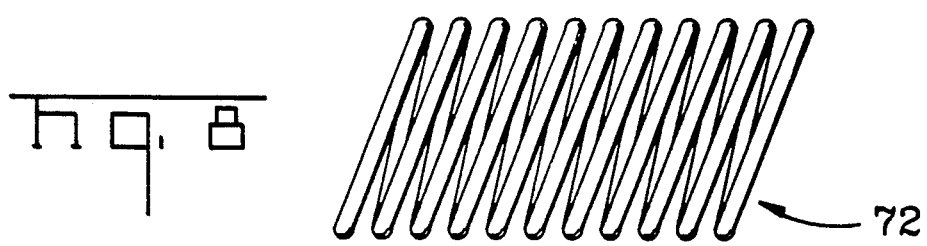
FIG. 8 is a side view of the coil contact of the invention substantially enlarged from the showing in FIGS. 1 and 4.
Figure 9:
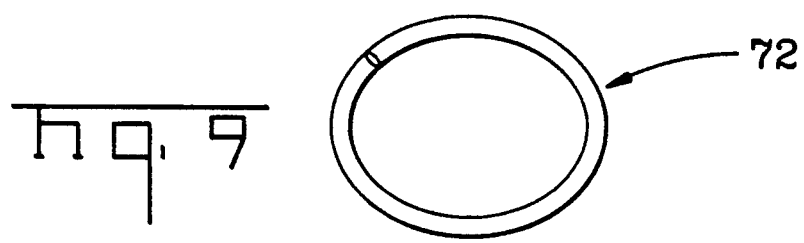
FIG. 9 is an end view of the coil contact shown in FIG. 8.

FIG. 3 shows the assembled planar connector insert 50 in more detail, and FIGS. 4, 5, and 6 show the plastic parts of the insert prior to the assembly as shown in FIG. 3. FIGS. 8 and 9 show coil springs 72 considerably enlarged from the showing in FIG. 3. As can be discerned from FIG. 4, the insert 50 includes a comb 51 having an end bar 52 and projecting at right angles thereto, a plurality of teeth 54 that are beveled at the ends as at 56. The teeth have a cross-sectional configuration as shown in FIG. 5 to include a width broader than the height and a rounded top and bottom surface shaped to fit within the coil springs 72. The teeth 54 are on centers corresponding to the centers of the rows of contact pads of the component 30 and circuit 12 and the beveled ends 56 facilitate an easy insertion of the coil springs 72 onto the teeth. FIG. 6 shows a cross bar 60 that includes apertures 66 extending thereacross on the centers of the teeth of the comb 51. Apertures 66 are of a cross-sectional configuration to readily receive the insertion of teeth therein. The ends of the cross bars 62 and 64 are split as at 70 to join the end apertures 66. As can be seen in FIG. 7, the cross bars have trapezoidal cross-sectional shape to define sloping end surfaces oriented at an angle A compatible with the angle of the coil springs 72 shown in FIGS. 8 and 9. This allows the coil springs to nest between the cross bars. The cross bars 60 are given a height slightly less than the height of the coil springs sufficient to allow a compression of the coil springs to result in an adequate normal force between the coil springs and the pads interconnected thereby. As can be discerned from the FIGS. 8 and 9, the coil springs are canted in a preferred embodiment to include a plurality of coils, such as the three coils shown, defining a plurality of contact points for the upper and lower pads interconnected thereby, the pads of the component 30 to the pads 14 of the board 12.

The springs have characteristics to develop contact forces sufficient to provide low resistance, stable interconnection. In assembly, comb 51 is first loaded with a first row of coil springs 72 with a first cross bar applied to the comb and positioned down against the coil springs 72. Thereafter, the ends, the slits 70 are compressed to lock the freshly loaded cross bar to the comb and lock springs 72 in place in a row extending across the comb. Slits 70 may be closed and welded shut to clamp the cross bar to the comb through the use of ultrasonic heat or the use of an adhesive or other bonding techniques. Next, a second row of coil springs is added to the comb and another cross bar, also suitably clamped to lock the springs in place. Then, a third row of coil springs is added and a third cross bar, following the configuration shown in FIG. 3. The next row of coil springs includes three on each end with no coil springs in the middle, that area corresponding to a lack of conductive pads on circuit board, that lack shown in FIG. 1 with respect to board 12 and contact pads 14. Thereafter, additional contact springs and cross members are added and affixed to the comb until the final end of cross bars shown as 60' are added at the ends with the apertures 66' fitted over the tapered ends of the teeth 54 of comb 51 and the end 70' clamped to finish the assembly of the contact insert 50. Thereafter, the insert 50 may be fitted together with a housing 20 and a component 30 and clamped by virtue of the clamp 38 into the position shown in FIG. 2 to effect a simultaneous interconnection of the pads through the compression of the springs 72 positioned to be compatible with the pads. In this way, a handleable, canted coil spring interconnect is provided for each set of contact pads with each spring having redundancy through the multiplicity of coils. In an actual embodiment of the invention, the insert comb and cross bars was formed of an injection molded, liquid crystal resin having a rough even dimension of 1.16 by 1.16 inches. The individual teeth had a dimension on the order of 0.20 inches in width and 0.008 inches in height being rounded, top and bottom, by a radius on the order of 0.021 inches. The holes 66 in the cross bars had a dimension on the order of 0.020 inches in width and 0.010 inches in height, with rounded corners of a radius on the order of 0.003 inches. The cross bars had a height of on the order of 0.0175 inches with the angle A being on the order of 27°. The canted coil springs 72 had a length of on the order of 0.030 inches with a noncompressed height of on the order of 0.025 inches and a pitch on the order of 0.0083 inches. Coils 72 had 120 coils per inch with a width on the order of 0.030 inches and were formed of beryllium copper number 172, suitably heat treated to a temper of 190–220K psi. These coils were given a bright finish and suitably plated with a gold over nickel plating. From the foregoing it should be apparent that extremely closely spaced contact pad centers can be accommodated.

It is to be understood that the foregoing example is for illustration purposes only, and that many variations in the connector of the invention, including the pattern of contacts, the dimensioning and number of comb teeth, the numbers of contacts and areas of the comb and cross bar can be varied to suit the application involved. While canted coil springs have been shown, the invention contemplates the use of other types of angular coil springs as well.

Having no described the invention relative to the illustrative drawings, claims are appended that are intended to cover what is inventive.

We claim:

1. A connector including a housing adapted to fit on a circuit having contact pads in a given array and receive a planar connector insert therewithin having coil springs on centers in said given array and a component fitted on top of the insert having contact pads in said given array with the said housing including clamping means to drive the said component against the said coil springs and the coil springs against the said circuit pads to effect an interconnection of component and circuit pads, the said planar insert being comprised of a plastic comb having cross bars with apertures adapted to fit over teeth extending across the plane of the insert spaced apart on centers compatible with the centers of the said pads of component and circuit, with each tooth receiving coil springs having a force characteristic to effect a stable, low resistance interconnection with the two springs inserted thereon to define rows of coil springs extending across said comb in a pattern compatible with the given array of component and circuit pads, further means fixing the cross bars to the comb to hold such coil springs in position in such array.

2. The connector according to claim 1 wherein said further means is comprised of splits at the ends of the cross bars held together to clamp a cross bar to the end teeth of the comb.

3. The connector according to claim 1 wherein the said coil springs are canted coil springs having a side configuration in a generally trapezoidal shape and the said cross bars have a side cross-sectional shape complementary to that of said coil springs.

4. The connector according to claim 1 wherein the said cross bars have a height slightly less than the height of a coil spring in order to limit the compression of the said coil spring and allow compression sufficient to develop normal forces of interconnection sufficient to provide the low resistance, stable interface between pads.

5. The connector according to claim 1 wherein the said teeth have a cross-sectional configuration in conjunction with the cross-sectional shape of the interior of the coil spring to hold the said coil spring against rotation on a given tooth.

6. A planar connector insert including a plastic comb having a plurality of teeth extending on centers compatible with the centers of rows of contact pads of a component and circuit, a plurality of individual coil springs fitted on and carried by such teeth with a plurality of cross bars fitted on and carried by such teeth in a stacking arrangement to define distinct rows of coil springs separated by distinct rows of cross bars, the coil springs being included on certain teeth and omitted from certain other teeth to define a pattern of springs compatible with the pattern of contact pads of a component and circuit and with the cross bars being locked to the teeth of a comb to hold the coil springs in proper position for disposition between a component and circuit and clamping to effect an interconnection between the contact pads thereof.

7. The insert according to claim 6 wherein the said coil springs have an oval configuration and the teeth of said comb have a configuration to fit within said coil springs and hold said coil springs against relative rotation.

8. A method of manufacturing a planar connector insert of a type adapted to interconnect planar arrays of contact pads of components to planar arrays of contact pads on circuits including the steps of:
   a. providing plastic comb including teeth on centers of rows of the pads of component and circuit to be interconnected,
   b. loading said teeth with coil springs inserted thereon and loading cross bars having apertures to fit on said teeth to define an array of contact springs with at least one spring for each pad of a component and circuit, and
   c. affixing the cross bars to the comb to hold said springs in position thereon.

9. The method according to claim 8 wherein the step of loading said coil springs on said teeth includes loading certain of said teeth with coil springs with certain others of said teeth being left vacant to define a pattern of coil springs compatible to the pattern of contact pads of component and circuit.

10. The method according to claim 8 wherein the step of affixing the said cross bars to the said comb includes clamping and bonding the ends of the cross bars to the teeth of the comb.

* * * * *